US010040687B2

United States Patent
Luo et al.

(10) Patent No.: US 10,040,687 B2
(45) Date of Patent: Aug. 7, 2018

(54) CARBON NANOTUBE SPONGE AND METHOD FOR MAKING THE SAME

(71) Applicants: Tsinghua University, Beijing (CN); HON HAI PRECISION INDUSTRY CO., LTD., New Taipei (TW)

(72) Inventors: Shu Luo, Beijing (CN); Jia-Ping Wang, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 149 days.

(21) Appl. No.: 14/792,621

(22) Filed: Jul. 7, 2015

(65) Prior Publication Data
US 2016/0009558 A1    Jan. 14, 2016

(30) Foreign Application Priority Data
Jul. 8, 2014   (CN) .......................... 2014 1 0320675

(51) Int. Cl.
| | |
|---|---|
| *B01J 19/08* | (2006.01) |
| *C01B 31/02* | (2006.01) |
| *C23C 16/26* | (2006.01) |
| *C23C 16/48* | (2006.01) |
| *B01J 20/20* | (2006.01) |
| *C23C 16/04* | (2006.01) |
| *C01B 32/168* | (2017.01) |
| *B01J 21/18* | (2006.01) |

(Continued)

(52) U.S. Cl.
CPC ......... *C01B 31/0253* (2013.01); *B01J 20/205* (2013.01); *C01B 32/168* (2017.08); *C23C 16/045* (2013.01); *C23C 16/26* (2013.01); *C23C 16/48* (2013.01); *B01J 21/185* (2013.01); *C02F 1/283* (2013.01); *C02F 2101/32* (2013.01)

(58) Field of Classification Search
None
See application file for complete search history.

(56) References Cited

U.S. PATENT DOCUMENTS

| | | | |
|---|---|---|---|
| 2007/0212538 A1* | 9/2007 | Niu ......................... | H01B 1/04 428/367 |
| 2008/0299374 A1* | 12/2008 | Choi ..................... | B82Y 30/00 428/220 |

(Continued)

OTHER PUBLICATIONS

CN101049926A Google Patents, English translated.*

(Continued)

*Primary Examiner* — David P Turocy
*Assistant Examiner* — Mohammad Mayy
(74) *Attorney, Agent, or Firm* — ScienBiziP, P.C.

(57) ABSTRACT

A method for making a carbon nanotube sponge requires a carbon nanotube source being obtained and an organic solvent being added. The organic solvent is ultrasonically agitated to form a flocculent structure. The flocculent structure is washed by water and a carbon nanotube sponge preform obtained by freeze-drying the flocculent structure in a vacuum. Finally, the carbon nanotube sponge itself is obtained by depositing a carbon layer on the carbon nanotube sponge preform. A carbon nanotube sponge obtained by above method is also presented.

1 Claim, 16 Drawing Sheets

(51) Int. Cl.
*C02F 1/28* (2006.01)
*C02F 101/32* (2006.01)

(56) References Cited

U.S. PATENT DOCUMENTS

2009/0096348 A1* 4/2009 Liu .................. H01J 29/20
 313/498
2011/0003174 A1* 1/2011 Hikata .................. B82Y 10/00
 428/688
2014/0339168 A1* 11/2014 Hong .................. B01D 69/147
 210/651

OTHER PUBLICATIONS

"Elastic improvement of carbon nanotube sponges by depositing amorphous carbon coating" Wenqi Zhao, Yibin Li, Shanshan Wang, Xiaodong He, Yuanyuan Shang, Qingyu Peng, Chao Wang, Shanyi Du, Xuchun Gui, Yanbing Yang, Quan Yuan, Enzheng Shi, Shiting Wu, Wenjing Xu, Anyuan Cao, Carbon, vol. 76 (2014) pp. 19-26.*
"Preparation of macroporous solid foam from multi-walled carbon nanotubes by freeze-drying technique", N. Thongprachan, K. Nakagawa, N. Sano, T. Charinpanitkul, W. Tanthapanichakoon, Materials Chemistry and Physics 112 (2008) 262-269.*
Continuation of Attachment(s) 4) Other: NPL; "Preparation of macroporous solid foam from multi-walled carbon nanotubes by freeze-drying technique", N. Thongprachan, K. Nakagawa, N. Sano, T. Charinpanitkul, W. Tanthapanichakoon, Materials Chemistry and Physics 112 (2008) 262-269.*
"Elastic improvement of carbon nanotube sponges by desposting amorphous carbon coating", Wenqi Zhao etc, Carbon, Sep. 30, 2014, 19, vol. 76.
"Preparation of macroporous solid foam from multi-walled carbon nanotubes by freeze-drying technique", N. Thongprachan etc, Materials Chemistry and Physics, Dec. 15, 2008, 262, vol. 112, No. 1.

* cited by examiner

US 10,040,687 B2

CARBON NANOTUBE SPONGE AND METHOD FOR MAKING THE SAME

CROSS-REFERENCE TO RELATED APPLICATIONS

This application claims all benefits accruing under 35 U.S.C. § 119 from China Patent Application No. 201410320675.4, filed on Jul. 8, 2014 in the China Intellectual Property Office, the disclosure of which is incorporated herein by reference.

FIELD

The present disclosure relates to a carbon nanotube sponge and a method for making the same.

BACKGROUND

Carbon nanotubes are tubules of carbon having diameters ranging from 0.5 nanometers to 100 nanometers. Carbon nanotubes are used in different applications such as field emitters, gas storage and separation, chemical sensors, and high strength composites, because of their thermal, electrical, and mechanical properties.

Because carbon nanotubes are microscopic structures, it is necessary to assemble the carbon nanotubes into macroscopic structures. A carbon nanotube sponge is one such kind of macroscopic structure. The carbon nanotube sponge is used in many different fields, such as filtration or adsorption. The carbon nanotube sponge is usually obtained by Chemical Vapor Deposition (CVD). However, the carbon nanotube sponge obtained by CVD is not fully elastomeric, which affects further applications.

BRIEF DESCRIPTION OF THE DRAWINGS

Implementations of the present technology will now be described, by way of example only, with reference to the attached figures.

DETAILED DESCRIPTION

Figure 1:
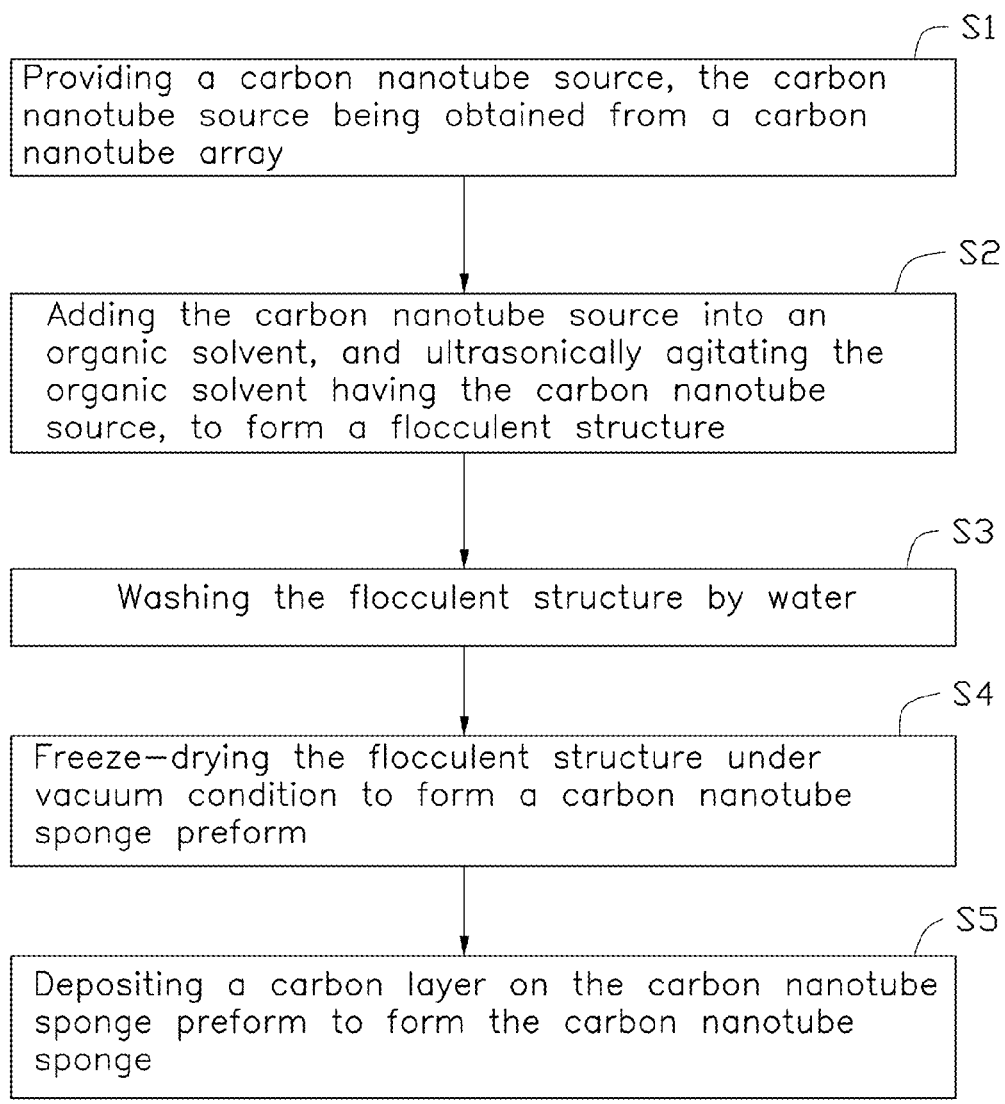
FIG. 1 shows a flow chart of one embodiment of a method of making a carbon nanotube sponge.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates one embodiment of a method for making a carbon nanotube sponge, which includes the following steps:

S1: providing a carbon nanotube source, the carbon nanotube source being obtained from a carbon nanotube array;

S2: adding the carbon nanotube source into an organic solvent, and ultrasonically agitating the organic solvent having the carbon nanotube source, to form a flocculent structure; and S3: washing the flocculent structure by water;

S4: freeze-drying the flocculent structure under vacuum condition to form a carbon nanotube sponge preform; and S5: depositing a carbon layer on the carbon nanotube sponge preform to form the carbon nanotube sponge.

In step S1, the carbon nanotube source can be made of carbon nanotubes. The carbon nanotubes can be single-walled carbon nanotubes, double-walled carbon nanotubes, or multi-walled carbon nanotubes. A diameter of the carbon nanotube can be in a range from about 20 nanometers to about 30 nanometers. A length of the carbon nanotubes can be longer than 100 micrometers. In one embodiment, the length of the carbon nanotubes is longer than 300 micrometers. The carbon nanotubes can be pure, meaning there are few or no impurities adhered on surface of the carbon nanotubes. A method for making the carbon nanotube source can include providing a carbon nanotube array, wherein the carbon nanotube array can be formed on a substrate, and scratching off the carbon nanotube array from the substrate to form the carbon nanotube source. The carbon nanotube source obtained directly from the carbon nanotube array makes the carbon nanotube sponge stronger. In one embodiment, the carbon nanotube array is a super-aligned carbon nanotube array. In the super-aligned carbon nanotube array, a length of the carbon nanotubes is virtually uniform and is longer than 300 micrometers. Surfaces of the carbon nanotubes are clean and without impurities.

In step S2, in one embodiment, the organic solvent has excellent wettability to the carbon nanotubes. The organic solvent can be ethanol, methanol, acetone, isopropanol, dichloroethane, chloroform, or the like. A mass ratio between the carbon nanotube source and the organic solvent can be selected according to actual need During a process of ultrasonically agitating the organic solvent having the carbon nanotube source, a power of ultrasonic waves can be in a range from about 300 W to about 1500 W. In some embodiments, the power is in a range from about 500 W to about 1200 W. A duration of the process can range from about 10 minutes to about 60 minutes. After the agitation, the carbon nanotubes of the carbon nanotube source are uniformly distributed in the organic solvent, to form the flocculent structure. Since the carbon nanotube source is scratched from the super aligned carbon nanotube array, the process of ultrasonic agitation does not separate the carbon nanotubes, the carbon nanotubes of the carbon nanotube source maintain the flocculent structure. The flocculent structure has a plurality of pores. Since the organic solvent has excellent wettability to the carbon nanotubes, the carbon nanotube source can be uniformly dispersed in the organic solvent.

In step S3, a freezing point of the organic solvent is lower than −100 Celsius, which is not appropriate for the subsequent freeze-drying. However, after a process of washing the flocculent structure by water, the plurality of pores of the flocculent structure are filled with water, which is suitable for the subsequent freeze-drying.

In step S4, a process of freeze-drying the flocculent structure under a vacuum condition includes steps of:

S41: placing the flocculent structure into a freeze drier, and rapidly cooling the flocculent structure to a temperature lower than −40 Celsius; and S42: creating a vacuum in the freeze drier and increasing the temperature of the flocculent structure to a room temperature in gradual stages, a period of drying in different stages ranges from about 1 hour to about 10 hours.

The process of freeze-drying the flocculent structure under a vacuum condition prevents the carbon nanotube sponge preform from collapsing, thus obtaining a fluffy carbon nanotube sponge. A density of the carbon nanotube sponge preform ranges from about 0.5 mg/cm$^3$ to about 100 mg/cm$^3$. The density of the carbon nanotube sponge preform can be changed according to practice.

In step S5, a method of depositing the carbon layer on the carbon nanotube sponge preform can be chemical vapor deposition, electrochemical deposition, or any other appropriate method. The chemical vapor deposition includes steps of supplying a carbon source gas to a furnace; heating the furnace at a temperature in the range from about 700Celsius to about 1230Celsius with a protective gas therein, to decompose the carbon source gas and form the carbon layer by deposition. A time of the process of depositing the carbon layer on the carbon nanotube sponge preform ranges from about 1 minute to about 240 minutes. A thickness of the carbon layer ranges from about 2 nanometers to about 100 nanometers. The carbon layer can be made of crystalline carbon, amorphous carbon, and/or combination thereof.

Figure 2:
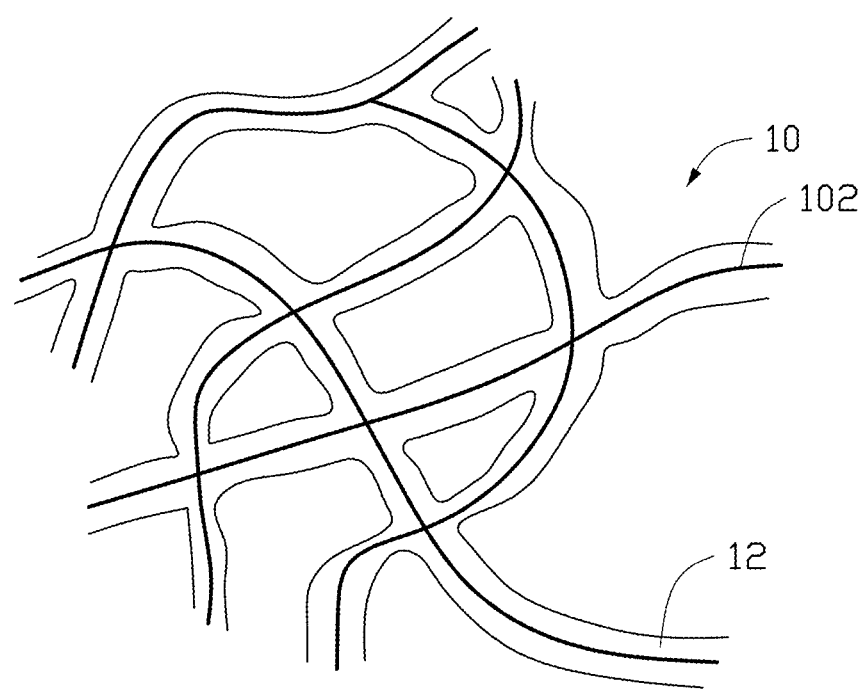
FIG. 2 shows a structure schematic of one embodiment of a carbon nanotube sponge.

FIG. 2 illustrates one embodiment of a carbon nanotube sponge. The carbon nanotube sponge includes a carbon nanotube net structure 10 and a carbon layer 12. In another embodiment, the carbon nanotube sponge consists of the carbon nanotube net structure 10 and the carbon layer 12. The carbon nanotube net structure 10 includes a plurality of carbon nanotubes 102 entangled with each other, thereby forming a plurality of pores in the carbon nanotube net structure 10. A specific surface area of the carbon nanotube net structure 10 is larger than 200 m$^2$/g. The carbon layer 12 is uniformly coated on each of the plurality of carbon nanotubes 102. The carbon layer 12 is unbroken at the junctions between the carbon nanotubes, to fix the plurality of carbon nanotubes 102 together. A mass ratio of the carbon layer 12 and the carbon nanotube net structure 10 ranges from about 0.01:1 to about 8:1. The wide range of the mass ratio enables a uniform coating by the carbon layer 12 and stronger fixings of the carbon nanotubes 102. The wide range of the mass ratio also avoids blocking any of the plurality of pores in the carbon nanotube net structure 10. In one embodiment, the mass ratio of the carbon layer 12 and the carbon nanotube net structure 10 ranges from about 0.05:1 to about 2:1.

A specific surface area of the carbon nanotube sponge can be larger than 200 m$^2$/g. A thickness of the carbon layer 12 ranges from about 2 nanometers to about 100 nanometers. The carbon layer 12 can be crystalline carbon, amorphous carbon, and/or combination thereof.

The carbon nanotube sponge of the present disclosure has excellent mechanical properties and large specific surface area. The carbon nanotube sponge can be used in oily waste treatment, wastewater treatment, or similar fields. Furthermore, the carbon nanotube sponge can be used as a lithium-ion battery cathode, a composite catalyst, or the like.

EXAMPLE 1

Providing a super-aligned carbon nanotube array, a diameter of the carbon nanotubes in the carbon nanotube array being about 20 nanometers, and a length of the carbon nanotubes in the carbon nanotube array being about 300 micrometers. Scratching off about 200 mg carbon nanotube array and adding it into 400 ml ethanol; and agitating the ethanol with 500W ultrasonic waves for about 30 minutes, to form a flocculent structure. Washing the flocculent structure by water. Freeze drying the flocculent structure, and rapidly cooling the flocculent structure to a temperature lower than −60Celsius. Then creating a vacuum in the freeze drier to a vacuum degree lower than 30 pa, and increasing the temperature of the flocculent structure in stages, the temperature of the flocculent structure being kept at about −25 Celsius for about 2 hours, at about −20 Celsius for about 2 hours, at about −15 Celsius for about 2 hours, at about −10 Celsius for about 2 hours, at about −5 Celsius for about 2 hours, at about 0 Celsius for about 2 hours, at about 5 Celsius for about 2 hours, at about 10 Celsius for about 2 hours, then and finally at about 15 Celsius for about 2 hours. A carbon nanotube sponge preform is obtained and taken out of the freeze drier. Placing the carbon nanotube sponge preform into a reactor, supplying acetylene and argon to the reactor; heating the reactor to 800 Celsius, to make the acetylene decompose and form a carbon layer. The carbon layer is deposited on the carbon nanotube sponge preform for about 15 minutes; and finally the carbon nanotube sponge itself is obtained. A weight percentage of the carbon layer in the carbon nanotube sponge is about 10%.

EXAMPLE 2

In this example, a carbon nanotube sponge is prepared by the same method as in Example 1, except that depositing the carbon layer on the carbon nanotube sponge preform lasts for about 30 minutes. The weight percentage of the carbon layer in the carbon nanotube sponge is about 40%.

EXAMPLE 3

In this example, a carbon nanotube sponge is prepared by the same method as in Example 1, except that depositing the carbon layer on the carbon nanotube sponge preform endures for about 45 minutes. The weight percentage of the carbon layer in the carbon nanotube sponge is about 70%.

COMPARATIVE EXAMPLE 1

In this example, a carbon nanotube sponge is prepared by the same method as in Example 1, except that the carbon nanotube source is a non-aligned carbon nanotube array.

COMPARATIVE EXAMPLE 2

In this example, a carbon nanotube sponge is prepared by the same method as in Example 1, except that carbon nanotubes of the carbon nanotube source in this example are intertwined together.

COMPARATIVE EXAMPLE 3

In this example, a carbon nanotube sponge is prepared by the same method as in Example 1, except that carbon nanotubes of the carbon nanotube source in this example are unevenly distributed and intertwined together.

Figure 3:
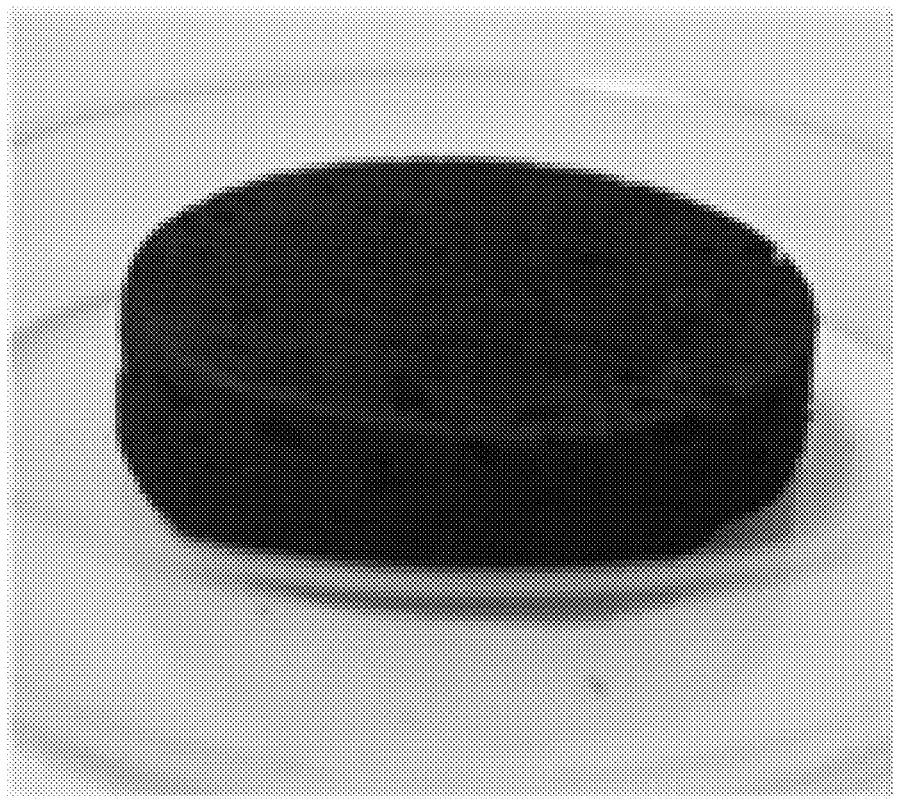
FIG. 3 is an image of a carbon nanotube sponge preform as in Example 1.
Figure 4:
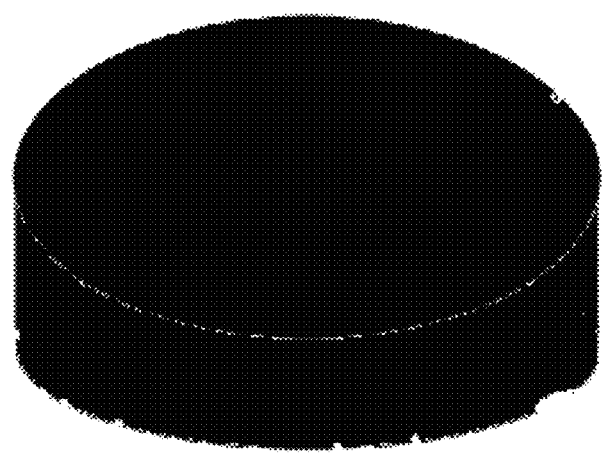
FIG. 4 shows a schematic of the carbon nanotube sponge preform as in Example 1.
Figure 5:
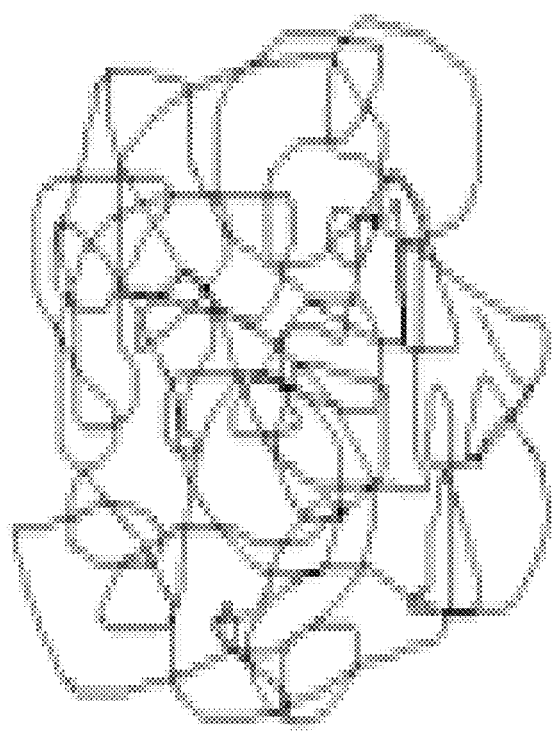
FIG. 5 shows a structure schematic of the carbon nanotube sponge preform as in Example 1.
Figure 6:
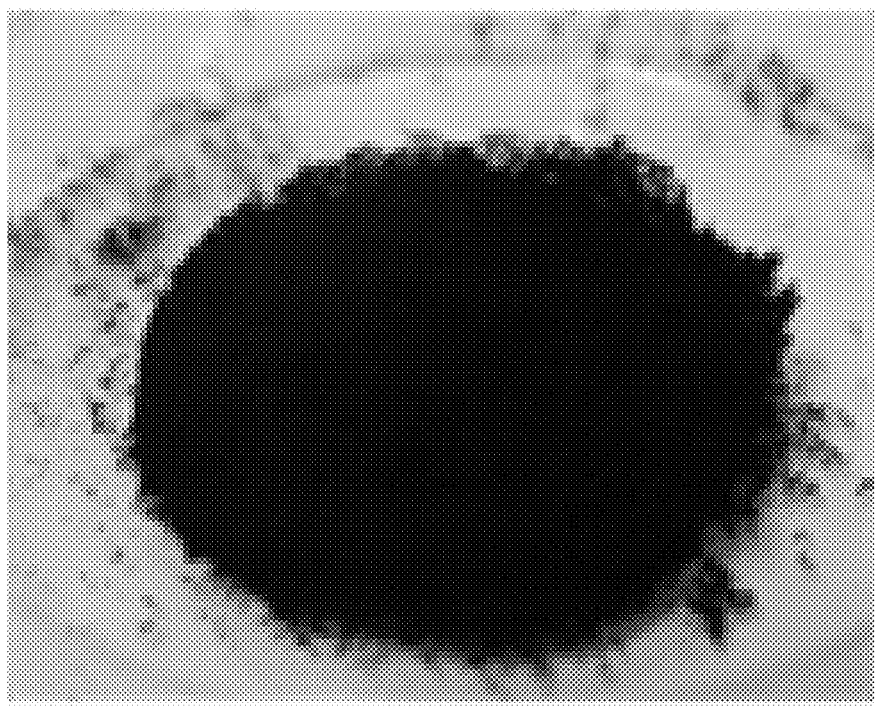
FIG. 6 is an image of a carbon nanotube sponge preform as in Comparative Example 1.
Figure 7:
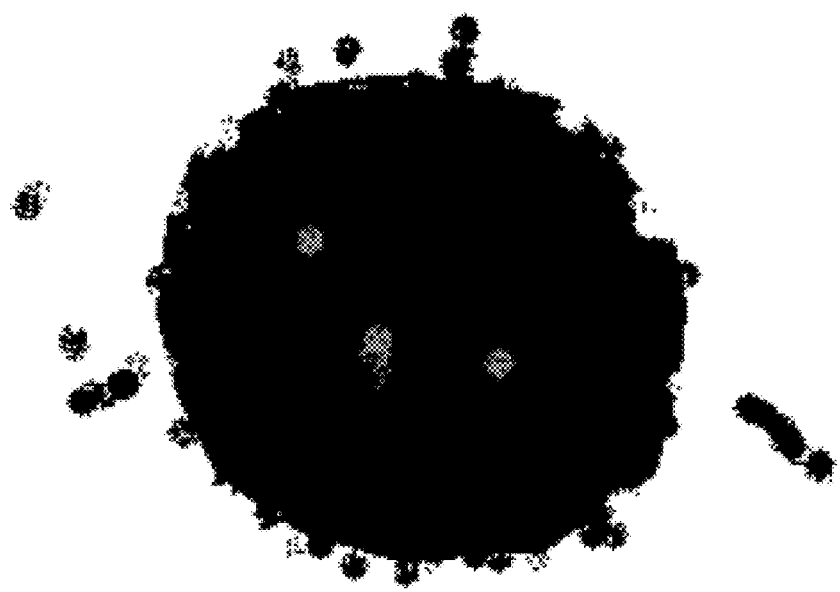
FIG. 7 shows a schematic of the carbon nanotube sponge preform as in Comparative Example 1.
Figure 8:
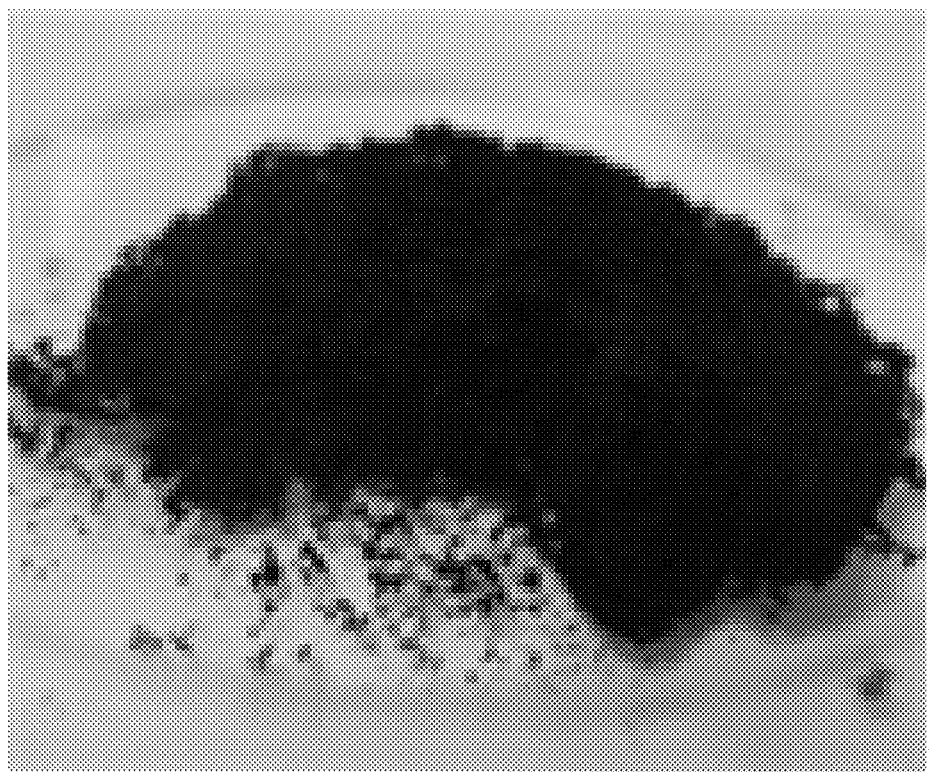
FIG. 8 is an image of a carbon nanotube sponge preform as in Comparative Example 2.
Figure 9:
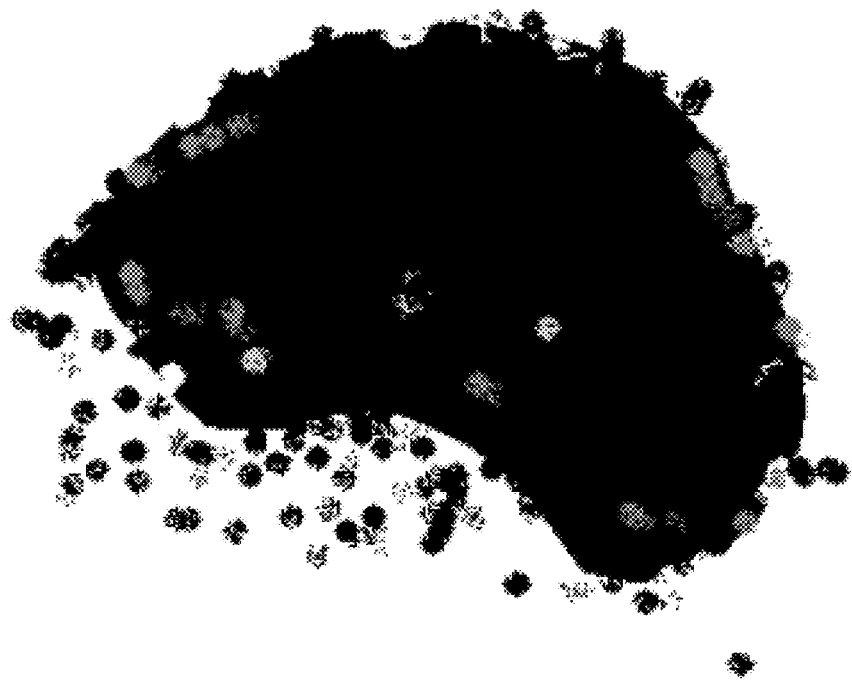
FIG. 9 shows a schematic of the carbon nanotube sponge preform as in Comparative Example 2.
Figure 10:
FIG. 10 is an image of a carbon nanotube sponge preform as in Comparative Example 3.
Figure 11:
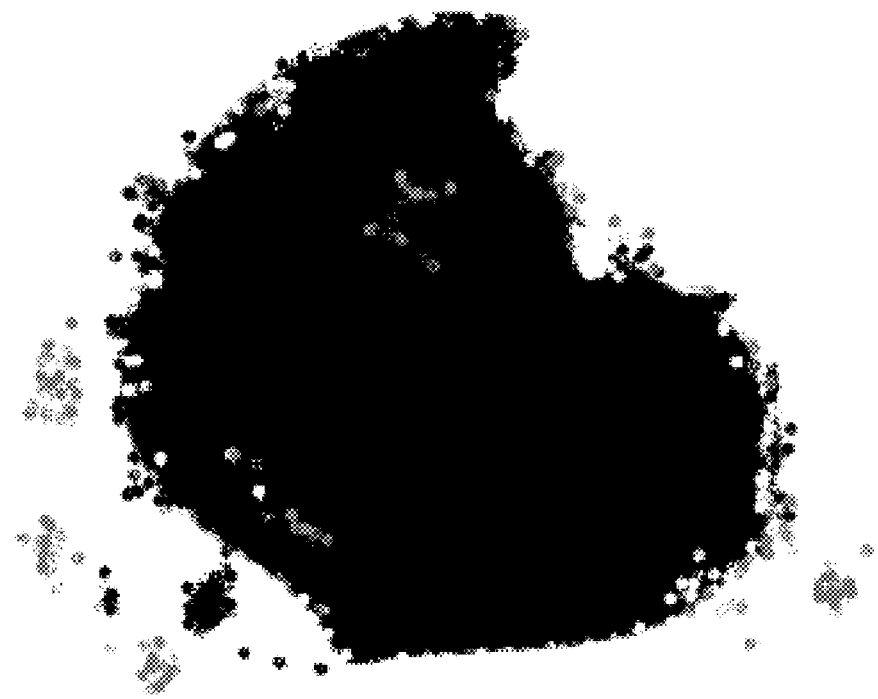
FIG. 11 shows a schematic of the carbon nanotube sponge preform as in Comparative Example 3.
Figure 12:
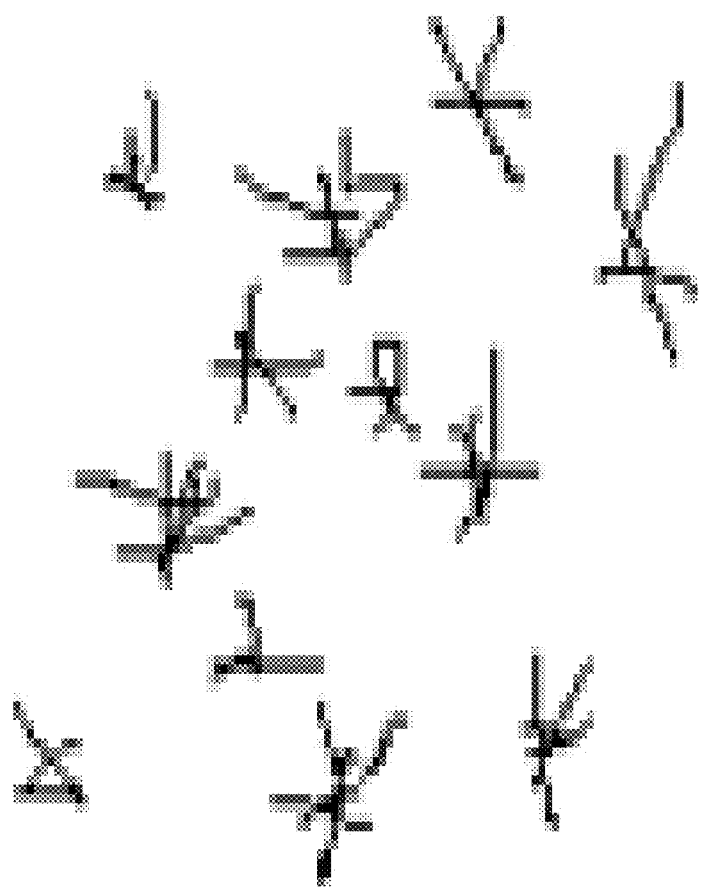
FIG. 12 shows a structure schematic of the carbon nanotube sponge preform as in Comparative Example 1-3.

FIGS. 3-5 show that the carbon nanotube sponge preform does not collapse, and the carbon nanotube sponge preform is a continuous three-dimensional network, and can be free standing.

FIGS. 6-12 show significant collapse in the carbon nanotube sponge performs of Comparative Examples 1-3, and each of the carbon nanotube sponge preforms of Comparative Examples 1-3 is not a continuous three-dimensional network. Thus even if the carbon layer is deposited on the carbon nanotube sponge preforms of Comparative Examples 1-3, it is difficult to form free standing structures.

Figure 13:
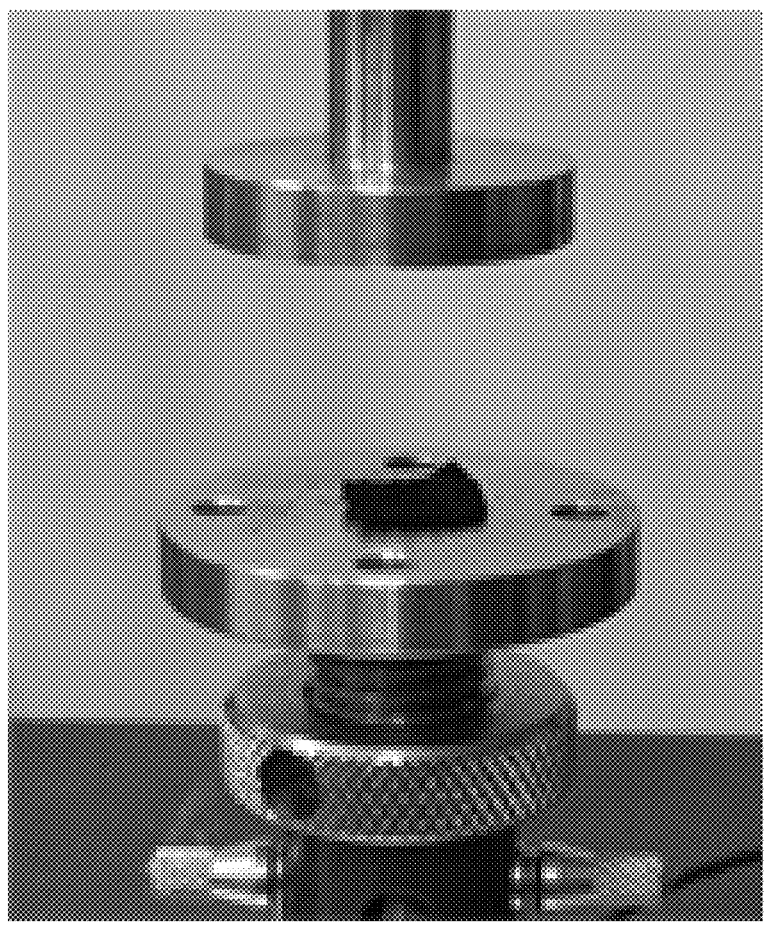
FIG. 13 is an image of the carbon nanotube sponge preform of Comparative Example 1 after a compression.
Figure 14:
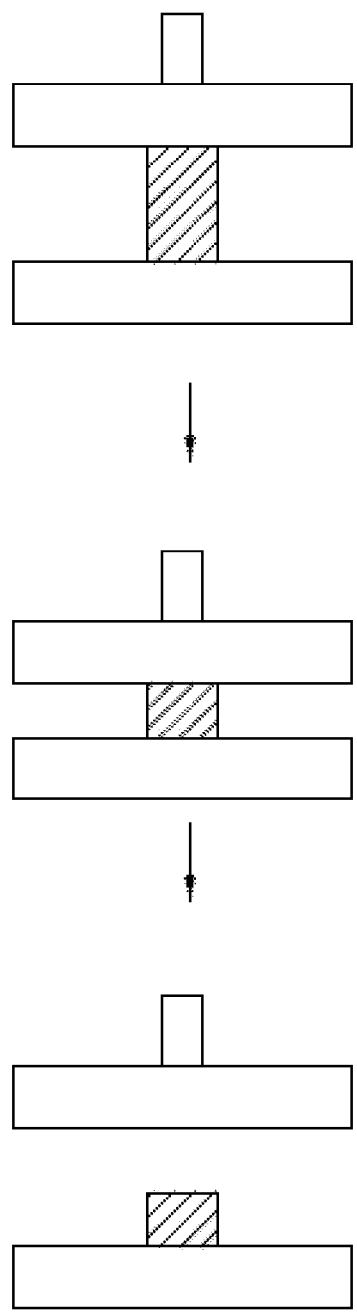
FIG. 14 shows a schematic of the carbon nanotube sponge preform of Comparative Example 1 after a compression.
Figure 15:
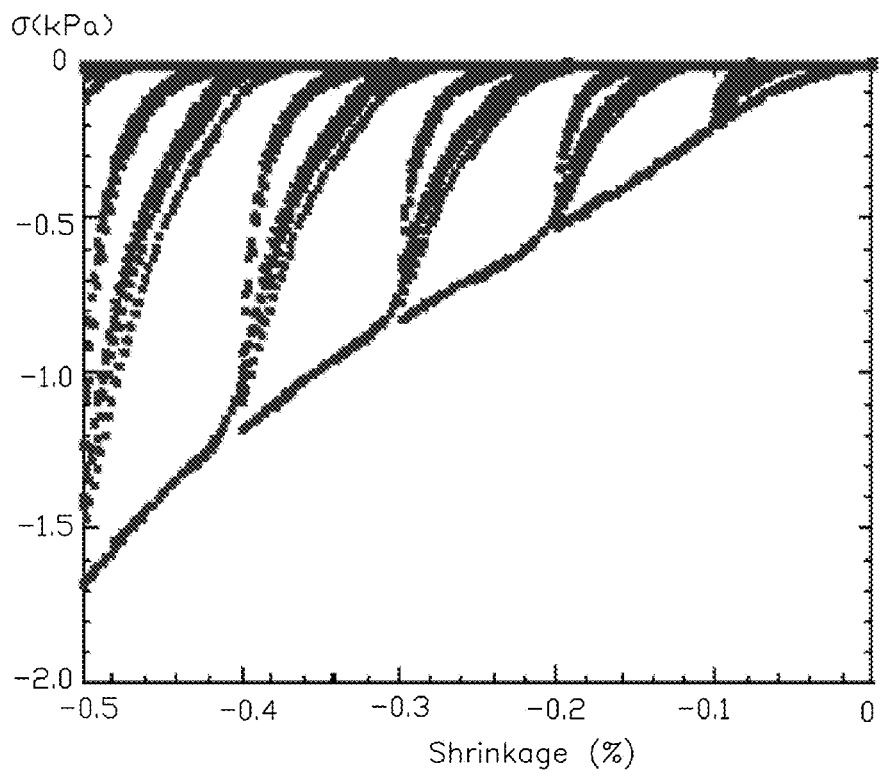
FIG. 15 shows a releasing stress and shrinkage curve of the carbon nanotube sponge preform of Comparative Example 1 after the compression.

FIGS. 13-15 show that the carbon nanotube sponge preform of Comparative Example 1 has almost no recovery after a compression.

Figure 16:
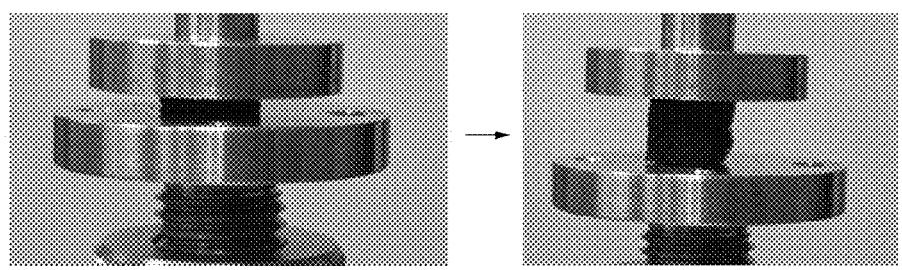
FIG. 16 is an image of the carbon nanotube sponge preform of Example 1 after a compression.
Figure 17:
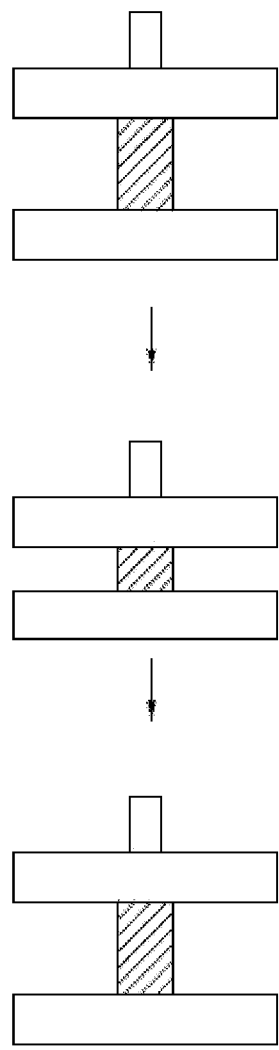
FIG. 17 shows a schematic of the carbon nanotube sponge preform of Example 1 after a compression.
Figure 18:
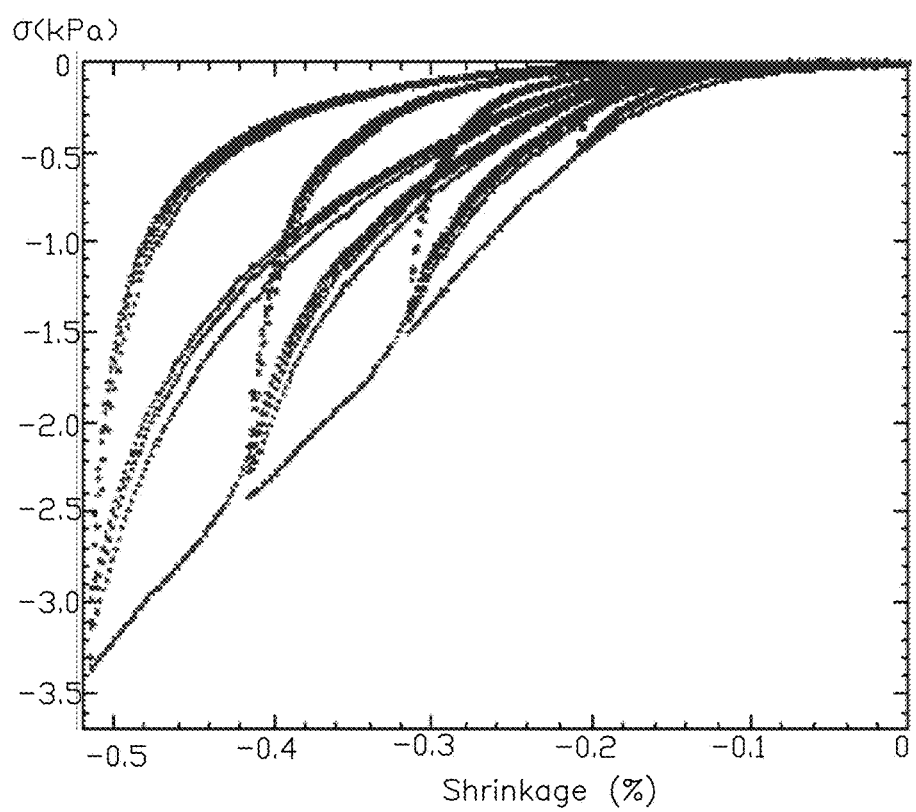
FIG. 18 shows a releasing stress and shrinkage curve of the carbon nanotube sponge preform of Example 1 after the compression.

FIGS. 16-18 show that the carbon nanotube sponge preform of Example 1 returns to substantially an original shape after a compression.

Figure 19:
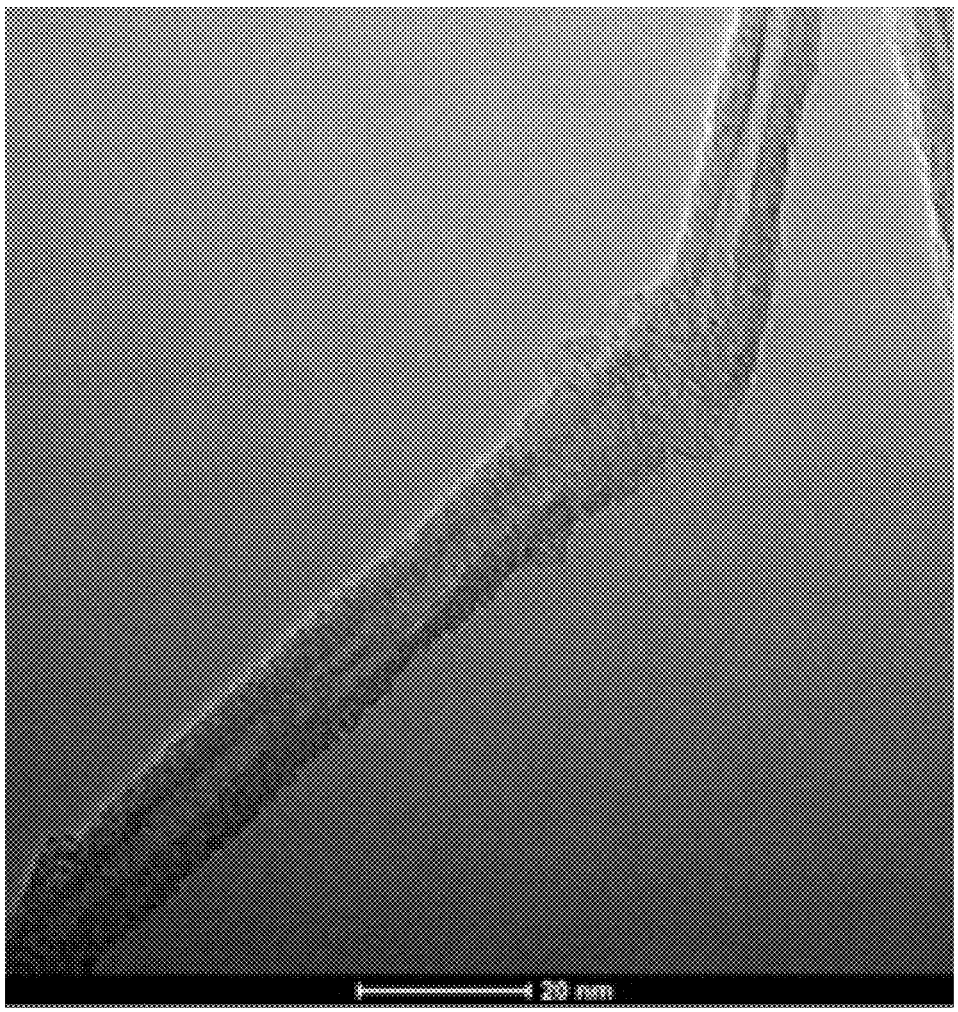
FIG. 19 is a Transmission Electron Microscope (TEM) image of a carbon nanotube sponge of Example 1.
Figure 20:
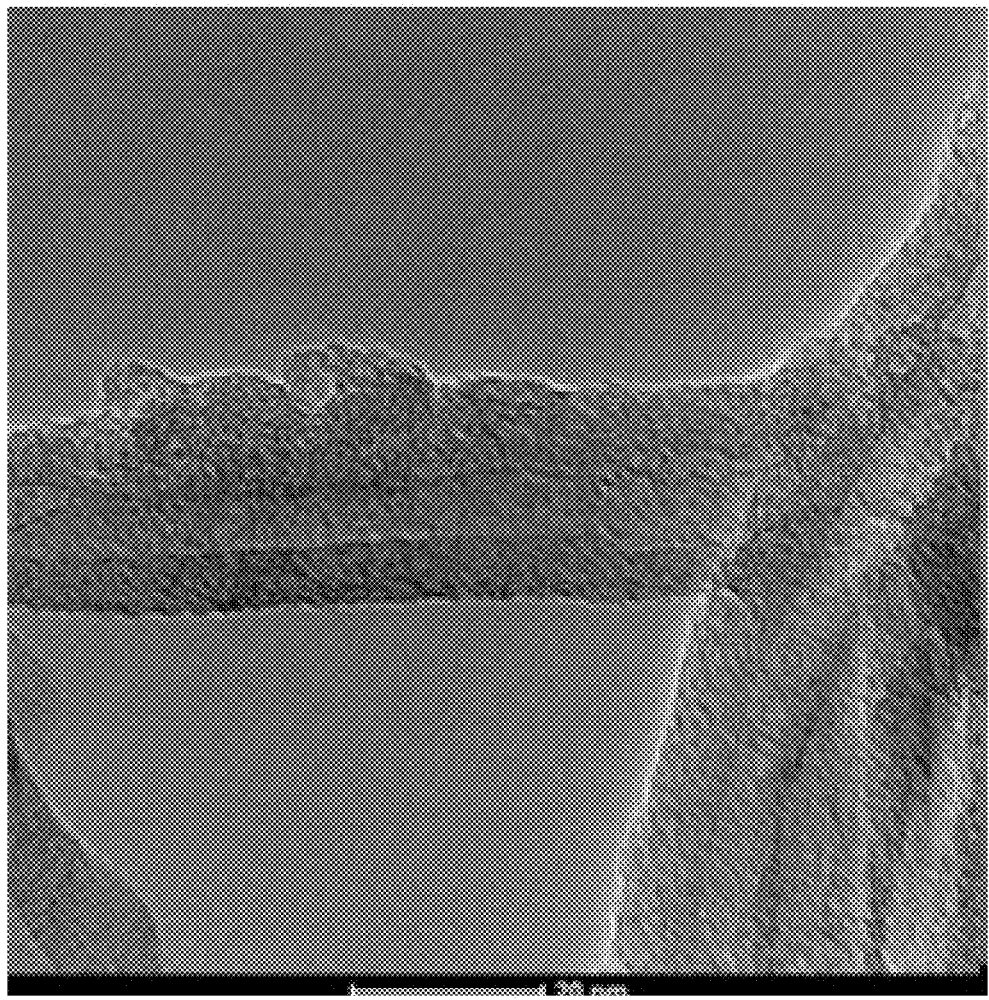
FIG. 20 is a TEM image of a carbon nanotube sponge of Example 2.
Figure 21:
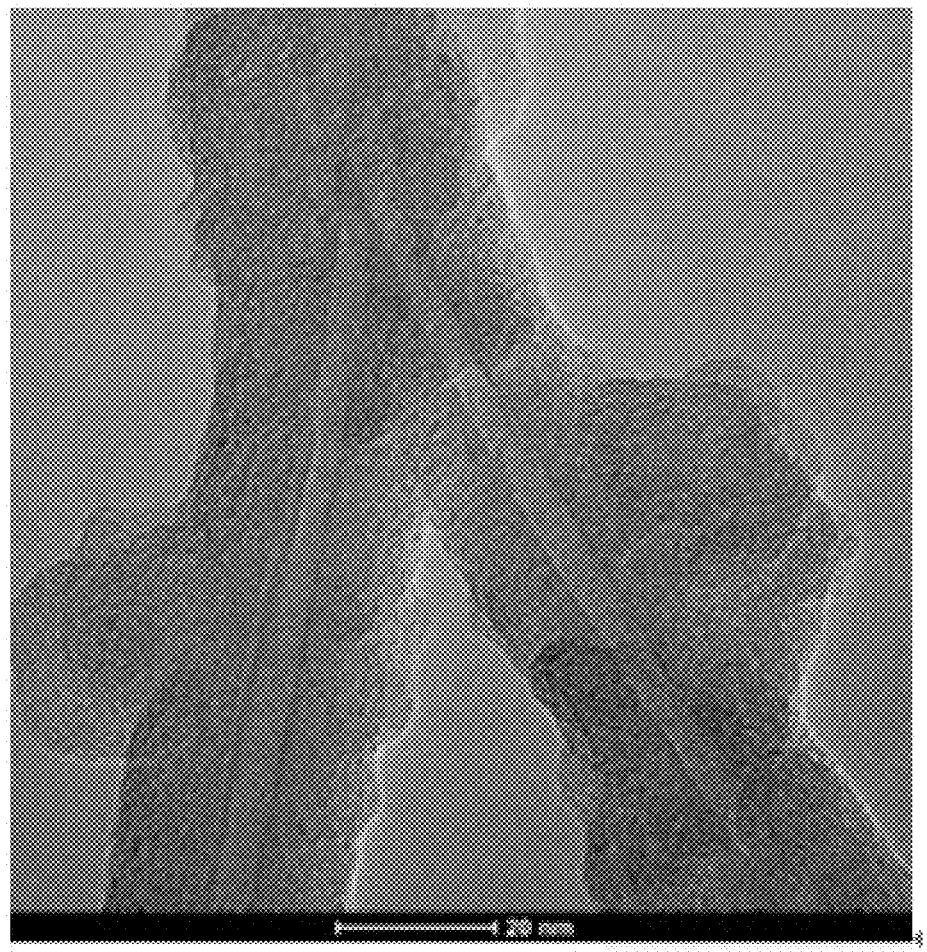
FIG. 21 is a TEM image of a carbon nanotube sponge of Example 3.

FIGS. 19-21 illustrate respective TEM images of the carbon nanotube sponges of Examples 1-3. FIGS. 17-19 show the carbon layer uniformly coating each of the plurality of carbon nanotubes, and the carbon layer is unbroken at the junctions between the carbon nanotubes. FIGS. 17-19 also show that the thickness of the carbon layer is constantly increasing with an increase of the deposition time.

The above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a carbon nanotube sponge, the method comprising:
    obtaining a carbon nanotube source by directly scraping from a super-aligned carbon nanotube array;
    adding the carbon nanotube source into an organic solvent, and ultrasonically agitating the organic solvent having the carbon nanotube source, to form a flocculent structure comprising a plurality of pores; and
    washing the flocculent structure with water, to fill the plurality of pores with water;
    freeze-drying the flocculent structure under vacuum to form a carbon nanotube sponge preform, wherein the carbon nanotube sponge preform is a continuous three-dimensional network, and a specific surface area of the carbon nanotube sponge preform is larger than 200 $m^2/g$; and
    depositing a carbon layer on the carbon nanotube sponge preform to form the carbon nanotube sponge, wherein the carbon layer is made of crystalline carbon.

* * * * *